(12) United States Patent
Cho et al.

(10) Patent No.: US 8,362,938 B2
(45) Date of Patent: Jan. 29, 2013

(54) ANALOG DIGITAL CONVERTING DEVICE

(75) Inventors: Young Kyun Cho, Daejeon (KR);
Young-deuk Jeon, Daejeon (KR);
Jaewon Nam, Daejeon (KR); Jong-Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 141 days.

(21) Appl. No.: 12/982,531

(22) Filed: Dec. 30, 2010

(65) Prior Publication Data

US 2012/0062406 A1    Mar. 15, 2012

(30) Foreign Application Priority Data

Sep. 13, 2010  (KR) .................. 10-2010-0089624

(51) Int. Cl.
*H03M 1/12* (2006.01)
(52) U.S. Cl. ........ 341/156; 327/356; 327/437; 327/530; 361/56; 363/125
(58) Field of Classification Search .......... 341/140–170; 327/356, 437, 530; 361/56; 363/20, 125
See application file for complete search history.

(56) References Cited

U.S. PATENT DOCUMENTS

| | | | | |
|---|---|---|---|---|
| 5,870,052 A * | 2/1999 | Dedic et al. | ............ | 341/161 |
| 6,304,203 B1 * | 10/2001 | Yamada | ............ | 341/159 |
| 6,380,881 B2 * | 4/2002 | Harada et al. | ............ | 341/165 |
| 6,567,028 B2 * | 5/2003 | Huang et al. | ............ | 341/155 |
| 6,919,837 B2 * | 7/2005 | Harada et al. | ............ | 341/163 |
| 7,038,609 B1 | 5/2006 | Hurrell | | |
| 7,053,810 B2 * | 5/2006 | Harada et al. | ............ | 341/163 |
| 7,161,512 B1 * | 1/2007 | Keskin | ............ | 341/118 |
| 7,205,921 B1 | 4/2007 | Savla | | |
| 7,515,083 B2 * | 4/2009 | Chen et al. | ............ | 341/156 |
| 7,773,012 B2 * | 8/2010 | Yoshinaga | ............ | 341/120 |
| RE42,878 E * | 11/2011 | Chen et al. | ............ | 341/156 |
| 2005/0231404 A1 * | 10/2005 | Harada et al. | ............ | 341/120 |
| 2008/0143576 A1 * | 6/2008 | Chen et al. | ............ | 341/162 |
| 2009/0207065 A1 | 8/2009 | Kim | | |
| 2010/0066583 A1 | 3/2010 | Jeon et al. | | |

FOREIGN PATENT DOCUMENTS

| | | |
|---|---|---|
| KR | 1020050041564 A | 5/2005 |
| KR | 1020050117321 A | 12/2005 |
| KR | 1020100056076 A | 5/2010 |

OTHER PUBLICATIONS

Chun-Cheng Liu et al., "A 10b 100MS/s 1.13mW SAR ADC with Binary-Scaled Error Compensation", 2010 IEEE International Solid-State Circuits Conference, Feb. 10, 2010, pp. 368-388, vol. 21, No. 5, IEEE.

* cited by examiner

*Primary Examiner* — Lam T Mai (57) ABSTRACT

Provided is an analog digital converting device which consumes a low power and guarantees fast operation characteristic. The analog digital converting device includes a sub-ADC and a successive approximation ADC. The sub-ADC converts an external analog signal into a first digital signal by using first and second reference voltages. The successive approximation ADC comprises a plurality of bit streams, and converts the external analog signal into a second digital signal according to a successive approximation operation using the first and second reference voltages. The successive approximation ADC receives the first digital signal, and converts the second digital signal in a state where one of the first and second reference voltages has been applied to the bit streams based on the first digital signal.

9 Claims, 5 Drawing Sheets

ANALOG DIGITAL CONVERTING DEVICE

CROSS-REFERENCE TO RELATED APPLICATIONS

This U.S. non-provisional patent application claims priority under 35 U.S.C. §119 of Korean Patent Application No. 10-2010-0089624, filed on Sep. 13, 2010, the entire contents of which are hereby incorporated by reference.

BACKGROUND OF THE INVENTION

The present invention disclosed herein relates to an analog digital converting device, and more particularly, to a successive approximation analog digital converter.

Recently, as the use of a mixed-mode system increases, the necessity of an analog digital converter (hereinafter referred to as ADC) is in a progressively increasing trend. Particularly, in systems such as Digital Video Disk Players (DVDPs) and Direct Broadcasting for Satellite Receivers (DBSRs), research is being actively conducted for one chip based on a Complementary Metal-Oxide Semiconductor (CMOS) process for the effective-cost. For this, an ADC design technology for directly processing a Radio Frequency (RF) signal is becoming an increasingly important issue.

Up to date, various types of ADCs have been proposed. Flash ADCs, pipeline ADCs and successive approximation ADCs are used in appropriate application fields in accordance with their characteristics. Generally, the flash ADCs have fast operation characteristic, but have a high power consumption rate. The successive approximation ADCs have a low power consumption rate and a simple circuit configuration, but have slow operation characteristic. Comparing with the flash ADCs and the successive approximation ADCs, the pipeline ADCs have the operation characteristic of an intermediate speed and an intermediate power consumption rate. Recently, research is being conducted on hybrid ADCs for supplementing the advantages and disadvantages of the above-described ADCs.

SUMMARY OF THE INVENTION

The present invention provides an analog digital converting device which consumes a low power and guarantees fast operation characteristic.

Embodiments of the present invention provide an analog digital converting device including: a sub-Analog Digital Converter (ADC) converting an external analog signal into a first digital signal by using first and second reference voltages; and a successive approximation ADC comprising a plurality of bit streams, and converting the external analog signal into a second digital signal according to a successive approximation operation using the first and second reference voltages. The analog digital converting device may further include a reference voltage generation circuit generating the first and second reference voltages.

In some embodiments, the successive approximation ADC may receive the first digital signal, and convert the second digital signal in a state where one of the first and second reference voltages has been applied to the bit streams based on the first digital signal.

In other embodiments, the bit streams may include bit streams respectively corresponding to M bits (where M is an integer) configuring the first digital signal, and bit streams respectively corresponding to N bits (where N is an integer) configuring the second digital signal. The successive approximation ADC may apply one of the first and second reference voltages to the bit streams respectively corresponding to the M bits based on the first digital signal.

In still other embodiments, the successive approximation ADC may include a comparator connected to bit streams respectively corresponding to the M bits.

In even other embodiments, each of the bit streams may include a passive capacitor.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the accompanying drawings, a portion irrelevant to a description of the present invention will be omitted for clarity. Like reference numerals refer to like elements throughout.

In this disclosure below, when one part (or element, device, etc.) is referred to as being 'connected' to another part (or element, device, etc.), it should be understood that the former can be 'directly connected' to the latter, or 'electrically connected' to the latter via an intervening part (or element, device, etc.). Furthermore, when it is described that one comprises (or includes or has) some elements, it should be understood that it may comprise (or include or has) only those elements, or it may comprise (or include or have) other elements as well as those elements if there is no specific limitation.

Figure 1:
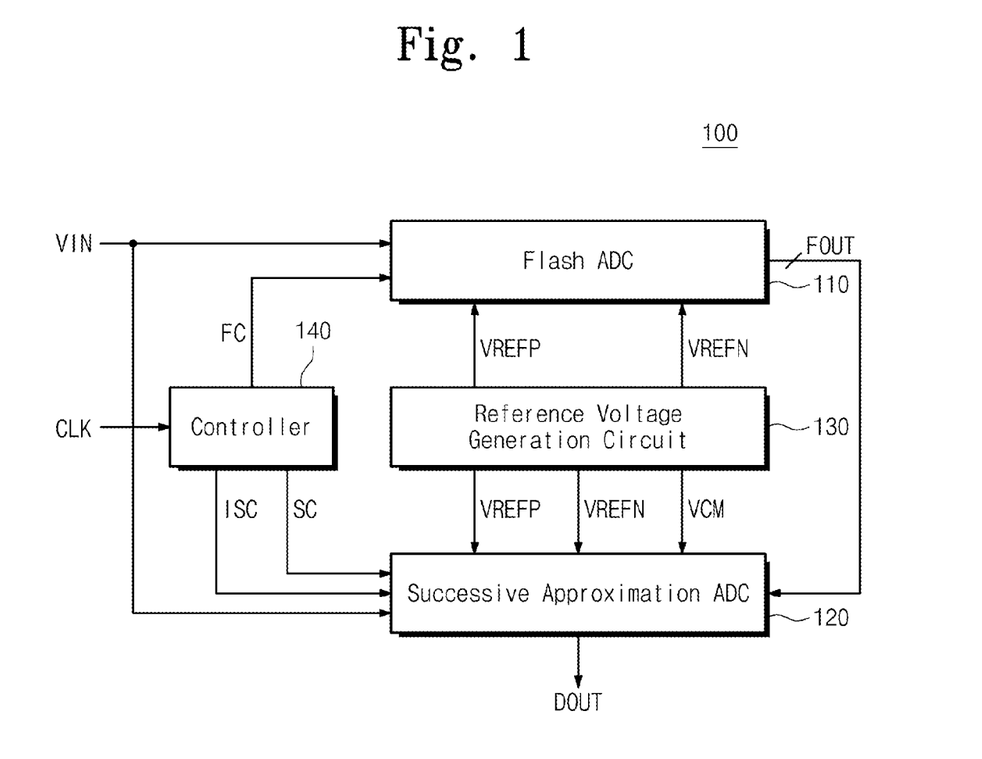
FIG. 1 is a block diagram illustrating an analog digital converting device according to an embodiment of the present invention.

FIG. 1 is a block diagram illustrating an analog digital converting device 100 according to an embodiment of the present invention.

Referring to FIG. 1, an analog digital converting device 100 according to an embodiment of the present invention includes a flash ADC 110, a successive approximation ADC 120, a reference voltage generation circuit 130, and a controller 140.

The flash ADC 110 is electrically connected to the successive approximation ADC 120, the reference voltage generation circuit 130 and the controller 140. The flash ADC 110 serves as a sub-ADC. That is, the analog digital converting device 100 includes the flash ADC 110 in FIG. 1, but may include another ADC instead of the flash ADC 110. For example, the analog digital converting device 100 may include a pipeline ADC (not shown) instead of the flash ADC 110.

The flash ADC 110 operates in response to a flash control signal FC received from the controller 140. The flash ADC 110 receives an analog voltage VIN from the outside. The flash ADC 110 receives first and second reference voltages VREFP and VREFN from the reference voltage generation circuit 130.

The flash ADC 110 converts the analog voltage VIN into a digital signal and generates a flash output signal FOUT by using the first and second reference voltages VREFP and VREFN. Exemplarily, the flash output signal FOUT may be an m-bit digital signal. The flash ADC 110 compares the analog voltage VIN with comparison voltages having different voltage levels to generate a digital signal at one time. This will be described below in detail with reference to FIG. 3.

The successive approximation ADC 120 is electrically connected to the flash ADC 110, the reference voltage generation circuit 130 and the controller 140. The successive approximation ADC 120 operates in response to an input sampling control signal ISC and a successive approximation control signal SC that are received from the controller 140. The successive approximation ADC 120 includes a plurality of bit streams. Herein, each of the bit streams includes a passive capacitor.

The successive approximation ADC 120 converts the external analog voltage VIN into a digital signal. The successive approximation ADC 120 receives the flash output signal FOUT from the flash ADC 110. The successive approximation ADC 120 converts the external analog voltage VIN into a digital signal on the basis of the flash output signal FOUT. For example, the successive approximation ADC 120 converts the received analog voltage VIN into an N-bit digital signal. At this point, the first and second reference voltages VREFP and VREFN may be used.

The successive approximation ADC 120 generates a digital output signal DOUT. The digital output signal DOUT may include the digital signal that has been converted in the successive approximation ADC 120 and the flash output signal FOUT. Exemplarily, the digital output signal DOUT may include the M-bit digital signal that has been determined in the flash ADC 110, and the N-bit digital signal that has been determined in the successive approximation ADC 120.

The reference voltage generation circuit 130 is electrically connected to the flash ADC 110 and the successive approximation ADC 120. The reference voltage generation circuit 130 provides the first and second reference voltages VREFP and VREFN to the flash ADC 110 and the successive approximation ADC 120. Furthermore, the reference voltage generation circuit 130 provides a common voltage VCM to the successive approximation ADC 120.

Although not shown, the reference voltage generation circuit 130 may receive a power source voltage (not shown) from the outside, and generate the first and second reference voltages VREFP and VREFN by using the received power source voltage.

The controller 140 is electrically connected to the flash ADC 110 and the successive approximation ADC 120. The controller 140 controls the overall operation of the analog digital converting device 100. The controller 140 receives a clock signal CLK from the outside. The controller 140 generates the flash control signal FC, the input sampling control signal ISC and the successive approximation control signal SC by using the received clock signal CLK.

According to an embodiment of the present invention, when the analog digital converting device 100 converts the analog voltage VIN into a K-bit digital signal, the flash ADC 110 determines the values of upper M bits from among the K bits. Furthermore, base on the upper M bits determined by the flash ADC 110, the successive approximation ADC 120 determines the values of lower N bits from among the K bits.

Figure 2:
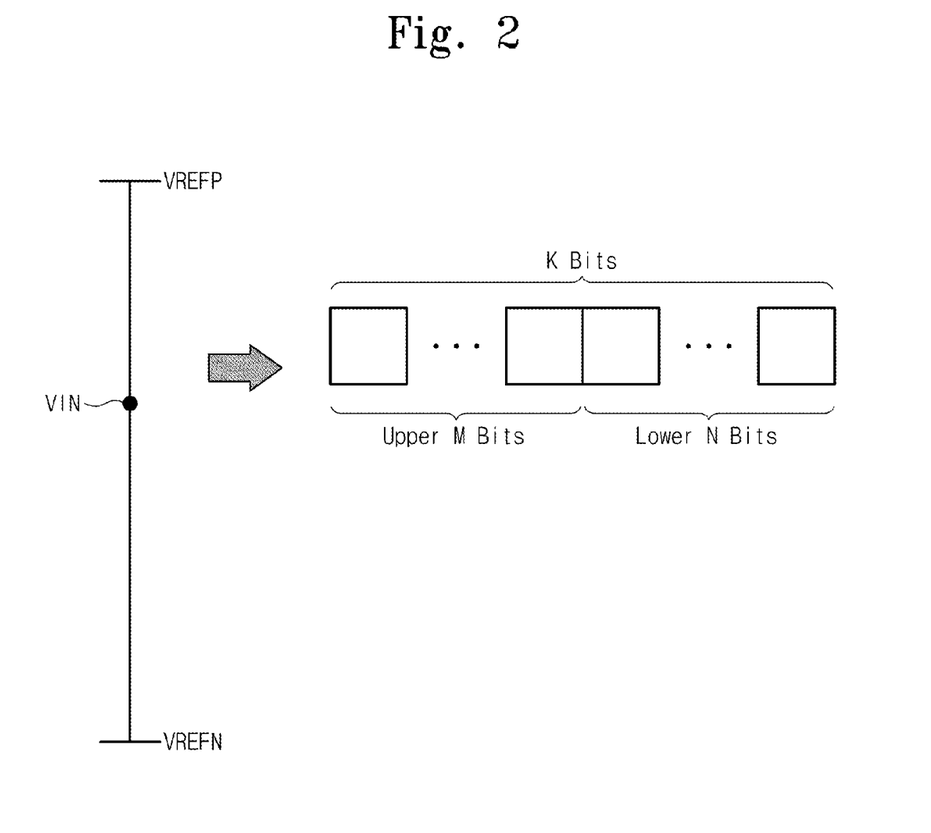
FIG. 2 is an exemplary diagram showing that an analog voltage of FIG. 1 is converted into a K-bit digital signal.

FIG. 2 shows that the analog voltage VIN of FIG. 1 is converted into the K-bit digital signal.

Referring to FIGS. 1 and 2, the level of the analog voltage VIN corresponds to the K-bit digital signal with respect to the first and second reference voltages VREFP and VREFN. The K bits are configured with the upper M bits and the lower N bits. The upper M bits are determined in the flash ADC 110. The lower N bits are determined in the successive approximation ADC 120.

Figure 3:
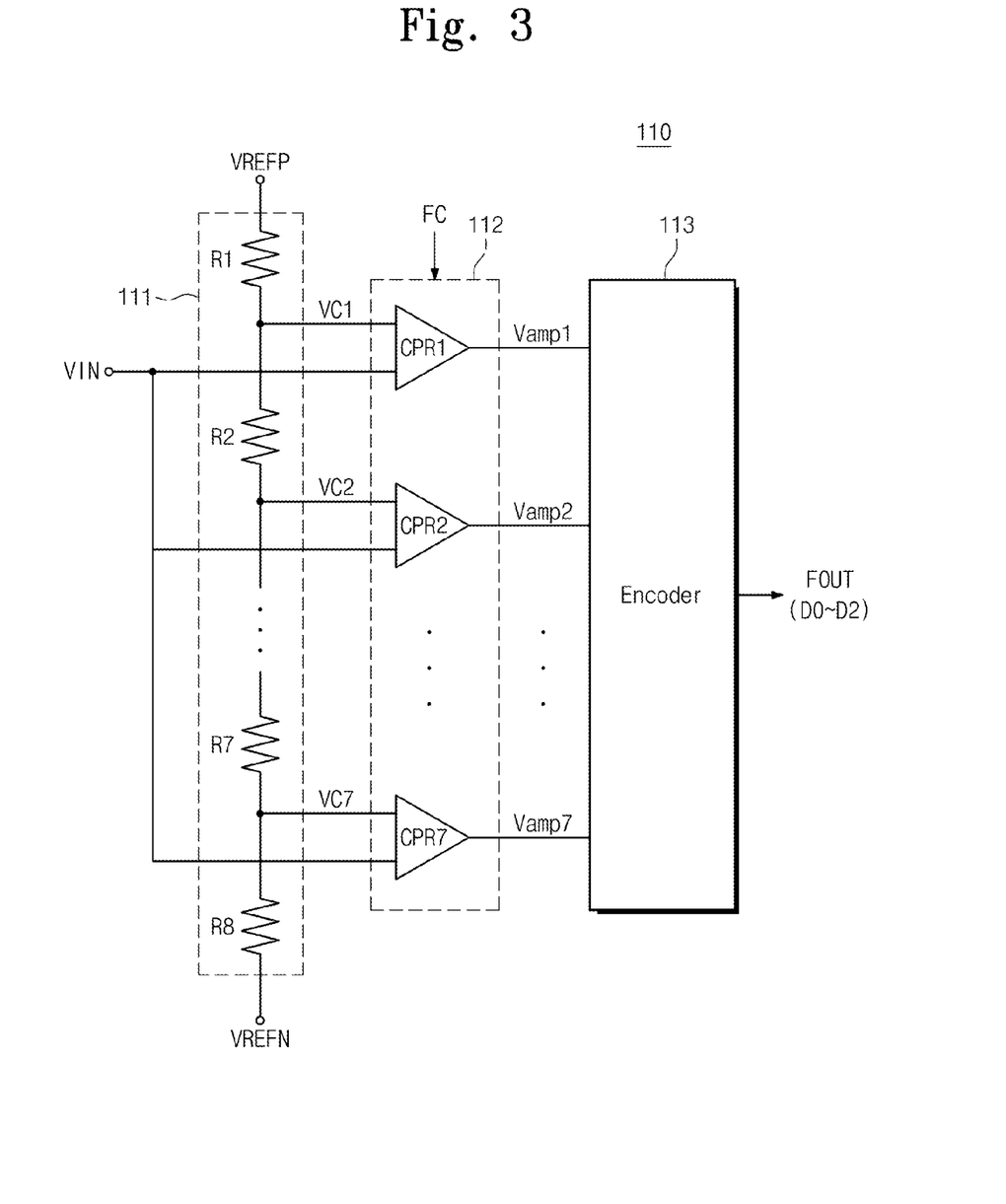
FIG. 3 is a block diagram illustrating a flash ADC of FIG. 1.

FIG. 3 is a block diagram illustrating the flash ADC 110 of FIG. 1. In FIG. 3, for convenience, the flash ADC 110 that converts the analog voltage VIN into a 3-bit digital signal is illustrated.

Referring to FIG. 3, the flash ADC 110 includes a comparison voltage generator 111, an amplifier 112, and an encoder 113. The comparison voltage generator 111 includes first to eighth resistors R1 to R8. The comparison voltage generator 111 generates first to seventh comparison voltages VC1 to VC7 by using the first and second reference voltages VREFP and VREFN provided from the reference voltage generation circuit 130. The first to seventh comparison voltages VC1 to VC7 are provided to the amplifier 112.

The amplifier 112 includes first to seventh comparators CPR1 to CPR7. The first to seventh comparators CPR1 to CPR7 receive the first to seventh comparison voltages VC1 to VC7, respectively. The first to seventh comparators CPR1 to CPR7 receive the analog voltage VIN. Each of the first to seventh comparators CPR1 to CPR7 amplifies a difference between the analog voltage VIN and the level of a comparison voltage received to it, and outputs the amplified signal. That is, the first to seventh comparators CPR1 to CPR7 outputs first to seventh amplification signals Vamp1 to Vamp7.

The encoder 113 is electrically connected to the amplifier 112. The encoder 113 receives the first to seventh amplification signals Vamp1 to Vamp7. The encoder 113 generates the flash output signal FOUT configured with upper 3 bits, based on the first to seventh amplification signals Vamp1 to Vamp7. The zeroth to second bits D0 to D2 of FIG. 3 correspond to the upper 3 bits.

Figure 4:
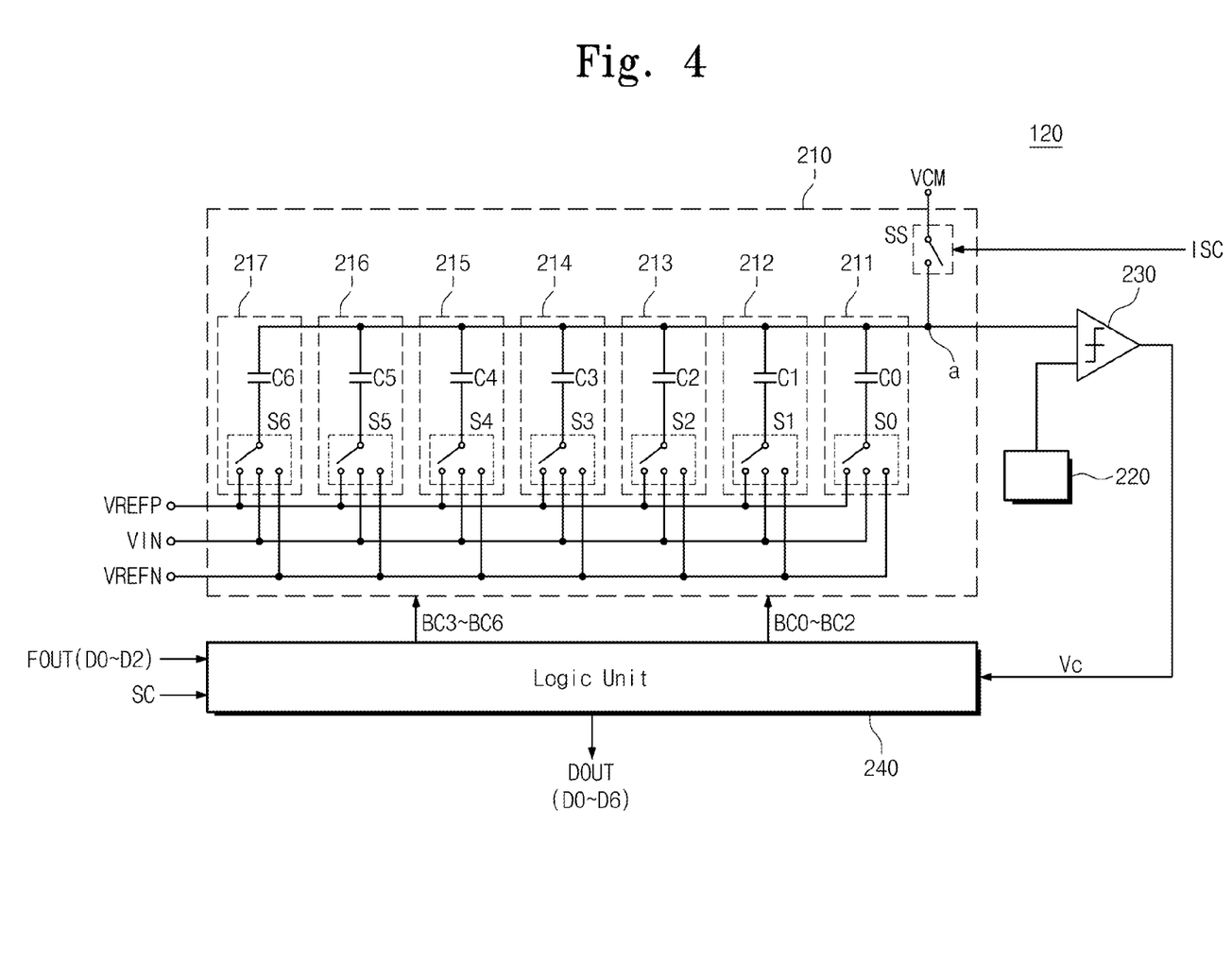
FIG. 4 is a block diagram illustrating a successive approximation ADC of FIG. 1.

FIG. 4 is a block diagram illustrating the successive approximation ADC 120 of FIG. 1. For convenience, FIG. 4 illustrates the successive approximation ADC 120 that determines lower 4 bits D3 to D6 on the basis of the upper 3 bits D0 to D2 of the flash output signal FOUT.

Referring to FIG. 4, the successive approximation ADC 1120 includes first and second conversion arrays 210 and 220, a logic unit 240, and a comparator 230. The first conversion array 210 includes a plurality of capacitors C0 to C6, zeroth to sixth switches S0 to S6, and a sampling switch SS. Zeroth to fifth capacitors C0 to C5 correspond to zeroth to fifth bits, respectively. From the fifth capacitor C5 to the zeroth capacitor C0, a capacitance sequentially increases by the exponent of 2. For example, as illustrated in FIG. 4, when the capacitance of the fifth capacitor C5 is C, the capacitances of the fourth to zeroth capacitors C4 to C0 may be 2C, 4C, 8C, 16C and 32C, respectively.

Zeroth to sixth capacitors C0 to C6 are connected to the comparator 230. The zeroth to sixth capacitors C0 to C6 are connected to the zeroth to sixth switches S0 to S6, respectively. The zeroth to sixth switches S0 to S6 operates in response to zeroth to sixth bit control signals BC0 to BC6, respectively. The first and second reference voltages VREFP and VREFN and the analog voltage VIN may be selectively applied to the zeroth to sixth capacitors C0 to C6, according to the operations of the zeroth to sixth switches S0 to S6.

Each bit stream comprises each switch and each capacitor. In other words, zeroth to sixth bit streams 211 to 217 include the zeroth to sixth capacitors C0 to C6 respectively. Furthermore, the zeroth to sixth bit streams 211 to 217 include the zeroth to sixth switches S0 to S6 respectively.

The sampling switch SS applies the common voltage VCM to a terminal (a) in response to the input sampling control signal ISC. Exemplarily, the common voltage VCM corresponds to a value that is obtained by dividing the sum of the first and second reference voltages VREFP and VREFN by 2. When an input sampling operation is performed, the sampling switch SS applies the common voltage VCM to the terminal (a). When the input sampling operation is performed, the common voltage VCM is applied to the one side of each of the zeroth to sixth capacitors C0 to C6, and the analog voltage VIN is applied to the other side of each of the zeroth to sixth capacitors C0 to C6. As a result, as the input sampling operation is performed, the analog voltage VIN is stored in each of the zeroth to sixth capacitors C0 to C6.

The second conversion array 220 has the same configuration as that of the first conversion array 210. However, the analog voltage VIN is inverted and inputted to the second conversion array 220. When some of the zeroth to sixth capacitors C0 to C6 are connected to the first reference voltage VREFP, the second reference voltage VREFN is applied to the corresponding capacitors of the second conversion array 220. Likewise, when some of the zeroth to sixth capacitors C0 to C6 are connected to the second reference voltage VREFN, the first reference voltage VREFP is applied to the corresponding capacitors of the second conversion array 220. That is, the successive approximation ADC 120 of FIG. 4 operates in a differential mode. However, the successive approximation ADC 120 according to an embodiment of the present invention may operate in a single mode.

The comparator 230 is connected to the first and second conversion arrays 210 and 220. The comparator 230 outputs a comparison signal Vc that is generated by amplifying a level difference between voltages inputted from the first and second conversion arrays 210 and 220.

The logic unit 240 receives the flash output signal FOUT, the successive approximation control signal SC and the comparison signal Vc. When the flash output signal FOUT is inputted, the logic unit 240 transmits zetoth to second bit control signals BC0 to BC2 to the first conversion array 210. The zeroth to second bit control signals BC0 to BC2 are determined based on the zeroth to second bits D0 to D2. In response to the zetoth to second bit control signals BC0 to BC2, the zeroth to second switches S0 to S2 selectively apply the first and second reference voltages VREFP and VREFN to the zeroth to second capacitors C0 to C2.

When the successive approximation control signal SC is received, the logic unit 240 transmits third to sixth bit control signals BC3 to BC6 to the first conversion array 210. The third to sixth switches S3 to S6 performs a successive approximation operation while selectively applying the first and second reference voltages VREFP and VREFN to the third to sixth capacitors C3 to C6.

While the successive approximation operation is being performed, the logic unit 240 determines lower 4 bits D3 to D6 on the basis of the comparison signal Vc. The third to sixth bits D3 to D6 of FIG. 4 correspond to the lower 4 bits, respectively. The logic unit 240 generates the third to sixth bit control signals BC3 to BC6, based on the third to sixth bits D3 to D6. This will be described below in more detail with reference to FIG. 5.

The logic unit 240 generates the digital output signal DOUT according to the upper 3 bits D0 to D2 and the lower 4 bits D3 to D6. At this point, the digital output signal DOUT may be configured with the zeroth to sixth bits D0 to D6.

Unlike in FIG. 4, the digital output signal DOUT may be configured with bits less than the 7 bits D0 to D6. Exemplarily, the logic unit 240 may include a digital correction logic (not shown). The digital correction logic corrects the digital errors of the received zeroth to sixth bits D0 to D6. The digital correction logic corrects a digital error and generates the digital output signal DOUT. That is, an error may be included in the zeroth to sixth bits D0 to D6, and the digital correction logic generates the digital output signal DOUT from which an error has been removed.

Exemplarily, the digital correction logic includes a memory (not shown) storing a correction value, and corrects the digital errors of the zeroth to sixth bits D0 to D6 on the basis of the stored correction value. Also, the digital correction logic may correct the digital errors of the zeroth to sixth bits D0 to D6, and generate the digital output signal DOUT configured with 5 bits.

In FIG. 4, it is illustrated that each of the first and second conversion arrays includes a plurality of capacitors. However, this is merely an example, and each of the first and second conversion arrays may be configured with other impedance devices. Furthermore, for convenience, a converter using a binary capacitor array is illustrated in FIG. 4, but even a converter using a split capacitor and a resistor and a converter using a unit capacitor array may be implemented in the same scheme.

Figure 5:
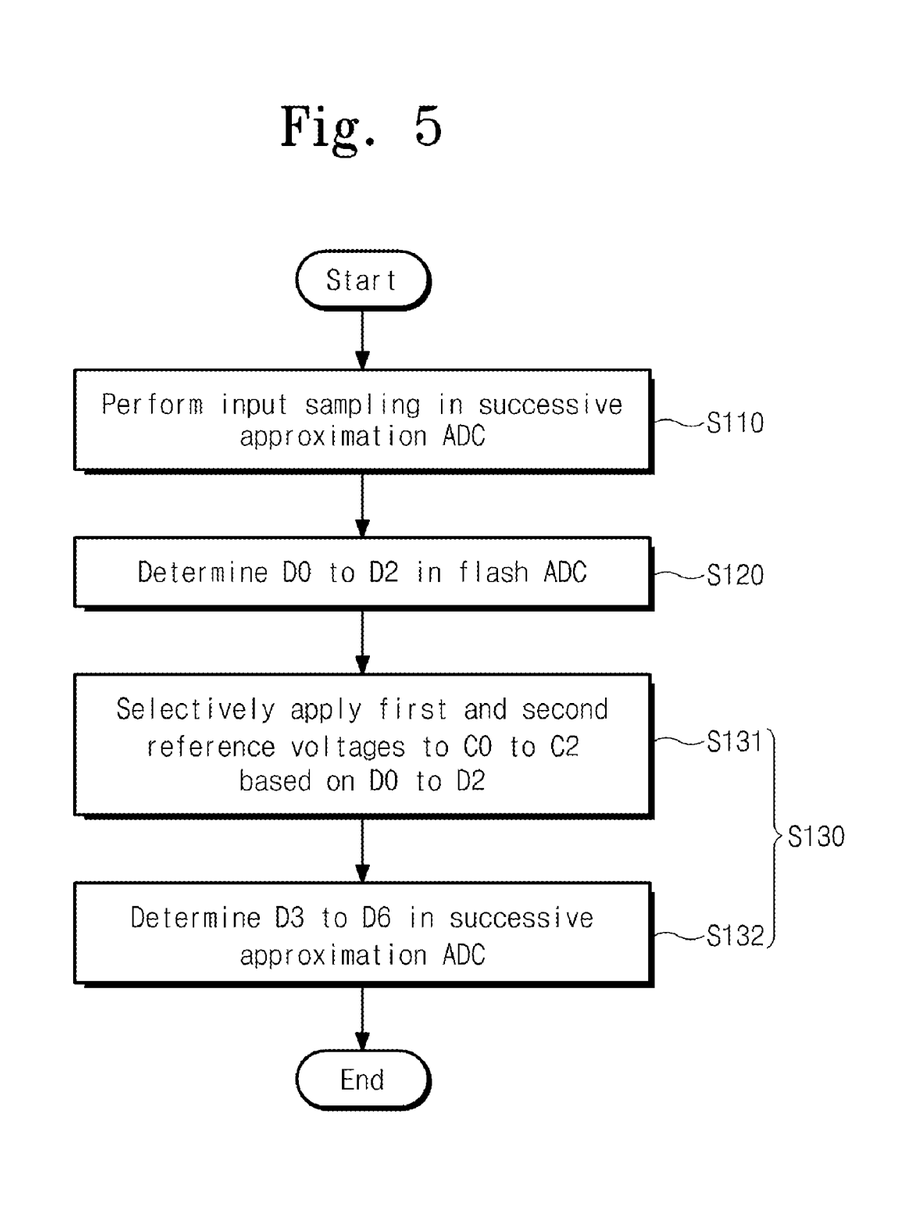
FIG. 5 is a flowchart illustrating an operation in which the analog digital converting device of FIG. 1 converts an analog voltage into a 6-bit digital signal.

FIG. 5 is a flowchart illustrating an operation in which the analog digital converting device 100 of FIG. 1 converts the analog voltage VIN into a 6-bit digital signal.

Referring to FIGS. 1, 3 and 4, in operation S110, the successive approximation ADC 120 performs the input sampling operation. The controller 140 transmits the input sampling control signal ISC to the successive approximation ADC 120. In response to the input sampling control signal ISC, the sampling switch SS (see FIG. 4) applies the common voltage VCM to the terminal (a). Furthermore, the zeroth to sixth switches S0 to S6 apply the analog voltage VIN to the zeroth to sixth capacitors C0 to C6, respectively. As a result, as the input sampling operation is performed, the analog voltage VIN is stored in the zeroth to sixth capacitors C0 to C6. When the input sampling operation is ended, the sampling switch SS is opened.

In operation S120, the flash ADC 110 determines the zeroth to second bits D0 to D2. As illustrated above with reference to FIG. 3, the flash ADC 110 generates the first to seventh comparison voltages VC1 to VC7 by using the first and second reference voltages VREFP and VREFN. Furthermore, the flash ADC 110 receives the flash control signal FC. In response to the flash control signal FC, the flash ADC 110 compares the first to seventh comparison voltages VC1 to VC7 and the analog voltage VIN. The flash ADC 110 outputs the flash output signal FOUT that is a 3-bit digital signal, according to the compared result. The 3 bits may be configured with the zeroth to second bits D0 to D2.

In operation S130, the successive approximation ADC 120 determines the third to sixth bits D3 to D6. The successive approximation ADC 120 determines the third to sixth bits D3 to D6, based on the zeroth to second bits D0 to D2 that have been converted in the flash ADC 110. Operation S130 includes operations S131 and S132.

In operation S131, the first and second reference voltages VREFP and VREFN are selectively applied to the zeroth to second capacitors C0 to C2 respectively corresponding to the converted zeroth to second bits D0 to D2. The logic unit 240 receives the flash output signal FOUT. The logic unit 240 generates the zeroth to second bit control signals BC0 to BC2, based on the zeroth to second bits D0 to D2. In response to the zeroth to second bit control signals BC0 to BC2, the zeroth to second switches S0 to S2 select one of the first and second reference voltages VREFP and VREFN. As an example, when any one of the zeroth to second bits D0 to D2 corresponds to a logical value "1", a corresponding switch selects the first reference voltage VREFP. As another example, when any one of the zeroth to second bits D0 to D2 corresponds to a logical value "0", a corresponding switch selects the second reference voltage VREFN.

For example, it is assumed that the zeroth to second bits D0 to D2 that have been converted in the flash ADC 110 are logical values "1", "0" and "1", respectively. In this case, the first reference voltage VREFP is applied to the zeroth capacitor C0, the second reference voltage VREFN is applied to the first capacitor C1, and a third reference voltage VREFP is applied to the second capacitor C2.

In operation S132, the successive approximation ADC 120 determines the third to sixth bits D3 to D6. That is, the successive approximation ADC 120 receives the successive approximation control signal SC. In response to the successive approximation control signal SC, the successive approximation ADC 120 determines the logical values of the third to sixth bits D3 to D6. Logical values from the Most Significant Bit (MSB) to the Least Significant Bit (LSB) of the third to sixth bits D3 to D6 are sequentially determined through the successive approximation operation.

That is, the logical values of the third to fifth bits D3 to D5 are sequentially determined through the successive approximation operation. When the logical value of the third bit D3 is determined, the first reference voltage VREFP is applied to the third capacitor C3. The second reference voltage VREFN is applied to capacitors corresponding to bits lower than the third bit D3. That is, the third switch S3 selects the first reference voltage VREFP. The fourth and fifth switches S4 and S5 select the second reference voltage VREFN. The sixth switch S6 is continuously connected to the second reference voltage VREFN during the successive approximation operation.

The comparator 230 generates the comparison signal Vc that is obtained by amplifying a level difference between voltages inputted from the first and second conversion arrays 210 and 220. The voltage level of the terminal (a) is determined according to the voltage level of the one side of each of the zeroth to sixth capacitors C0 to C6. For example, the voltage level of the terminal (a) may be determined according to the rate of the capacitances of capacitors receiving the first reference voltage VREFP to the capacitances of capacitors receiving the second reference voltage VREFN.

The logic unit 240 determines whether the third bit D3 is a logical value "1" or "0", based on the comparison signal Vc. When the third bit D3 is the logical value "1", the logic unit 240 generates the third bit control signal BC3 in order for the third switch S3 to maintain the selection of the first reference voltage VREFP. When the third bit D3 is the logical value "0", the logic unit 240 generates the third bit control signal BC3 in order for the third switch S3 to maintain the selection of the second reference voltage VREFN. At this point, the fourth and fifth switches S4 and S5 maintain the selection of the second reference voltage VREFN.

Like the third bit D3, the logical values of the fourth and fifth bits D4 and D5 are determined.

According to an embodiment of the present invention, the successive approximation ADC 120 controls a reference voltage applied to the zeroth to second capacitors C0 to C2, based on the values of the upper M bits that have been determined in the flash ADC 110. The successive approximation ADC 120 determines the values of the lower N bits. The flash ADC 110 and the successive approximation ADC 120 perform digital conversion, and thus the analog digital converting device consumes a low power and guarantees fast operation characteristic.

According to embodiments of the present invention, by performing analog-to-digital conversion with the successive approximation ADC and the flash ADC, the analog digital converting device consumes a low power and fast operation characteristic.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An analog digital converting device comprising:
   a reference voltage generation circuit configured to generate first and second reference voltages;
   a sub-Analog Digital Converter (ADC) configured to convert an external analog signal into a first digital signal by using the first and second reference voltages; and
   a successive approximation ADC comprising a plurality of bit streams, and configured to convert the external analog signal into a second digital signal according to a successive approximation operation using the first and second reference voltages,
   wherein the successive approximation ADC is configured to receive the first digital signal, and generate the second digital signal by applying one of the first and second reference voltages to the bit streams based on the first digital signal, and
   wherein the successive approximation ADC is configured to generate a digital output signal comprising the first and second digital signals, and bits of the first digital signal are upper bits than bits of the second digital signal.

2. The analog digital converting device of claim 1, wherein:
   the plurality of bit streams comprise bit streams respectively corresponding to M bits, where M is an integer, configuring the first digital signal and bit streams respectively corresponding to N bits, where N is an integer, configuring the second digital signal, and
   the successive approximation ADC is configured to apply one of the first and second reference voltages to the bit streams respectively corresponding to the M bits based on the first digital signal.

3. The analog digital converting device of claim 2, wherein:
   the successive approximation ADC comprises a comparator coupled to the plurality of bit streams, and
   each of the plurality of bit streams comprises a passive capacitor.

4. The analog digital converting device of claim 3, wherein the successive approximation ADC is configured to determine a value of the N bits according to a voltage received by the comparator while applying one of the first and second reference voltages to the bit streams respectively corresponding to the N bits.

5. The analog digital converting device of claim 2, wherein the successive approximation ADC is configured to sequentially determine values from a Most Significant Bit (MSB) to a Least Significant Bit (LSB) from among the N bits.

6. The analog digital converting device of claim 1, wherein the sub-ADC and the successive approximation ADC receive the analog signal.

7. The analog digital converting device of claim 1, wherein the sub-ADC is configured to compare a voltage level of the analog signal and at least one voltage level between the first and second reference voltages to determine a value of the first digital signal.

8. The analog digital converting device of claim 1, wherein:
the sub-ADC comprises a plurality of resistors which are coupled in series, and
the sub-ADC is configured to compare levels of a plurality of voltages, which are generated by applying the first and second reference voltages to the resistors, with a voltage level of the analog signal to determine a value of the first digital signal.

9. The analog digital converting device of claim 1, wherein the sub-ADC comprises a flash ADC.

* * * * *